(12) United States Patent
Champion et al.

(10) Patent No.: US 8,653,377 B2
(45) Date of Patent: Feb. 18, 2014

(54) MICROELECTRONIC ASSEMBLIES

(75) Inventors: Shaun L. Champion, Redondo Beach, CA (US); Philip H. Ives, Redondo Beach, CA (US); Harry A. Andreas, Manhattan Beach, CA (US); Norman C. Lee, Monterey Park, CA (US); Karrie D. Dooley, El Segundo, CA (US)

(73) Assignee: Raytheon Company, Waltham, MA (US)

( * ) Notice: Subject to any disclaimer, the term of this patent is extended or adjusted under 35 U.S.C. 154(b) by 189 days.

(21) Appl. No.: 13/080,013

(22) Filed: Apr. 5, 2011

(65) Prior Publication Data

US 2012/0257358 A1    Oct. 11, 2012

(51) Int. Cl.
*H05K 1/00*    (2006.01)

(52) U.S. Cl.
USPC .......................................................... 174/254

(58) Field of Classification Search
None
See application file for complete search history.

(56) References Cited

U.S. PATENT DOCUMENTS

| | | | |
|---|---|---|---|
| 3,923,359 A * | 12/1975 | Newsam ..................... | 439/75 |
| 5,176,526 A | 1/1993 | Hillbish et al. | |
| 5,407,362 A | 4/1995 | Carstens et al. | |
| 5,575,686 A * | 11/1996 | Noschese ................. | 439/620.21 |
| 5,789,816 A * | 8/1998 | Wu ............................... | 257/723 |
| 5,793,998 A | 8/1998 | Copeland et al. | |
| 5,963,426 A | 10/1999 | Hayden et al. | |
| 6,009,488 A | 12/1999 | Kavipurapu | |
| 6,111,756 A * | 8/2000 | Moresco ...................... | 361/735 |
| 6,541,712 B1 | 4/2003 | Gately et al. | |
| 6,995,043 B2 * | 2/2006 | Corisis et al. ................. | 438/125 |
| 7,056,128 B2 | 6/2006 | Driscoll et al. | |
| 7,151,316 B2 * | 12/2006 | Misumi ......................... | 257/777 |
| 7,152,136 B1 | 12/2006 | Charagulla | |
| 7,425,137 B1 | 9/2008 | Sipe et al. | |
| 7,480,748 B2 * | 1/2009 | Sim et al. ....................... | 710/38 |
| RE41,826 E * | 10/2010 | Nishida et al. ................ | 257/777 |
| 7,888,808 B2 * | 2/2011 | Suzuki et al. ................. | 257/786 |
| 2008/0284611 A1 | 11/2008 | Leedy | |
| 2009/0103273 A1 | 4/2009 | Costello | |
| 2009/0294944 A1 * | 12/2009 | Huang et al. .................. | 257/686 |

* cited by examiner

*Primary Examiner* — Jinhee Lee
*Assistant Examiner* — Xanthia C Cunningham
(74) *Attorney, Agent, or Firm* — Pierce Atwood LLP; Joseph M. Maraia

(57) ABSTRACT

Embodiments enable for the creation of microelectronic modules that may be configured in any order within a microelectronic assembly. The microelectronic modules provide for point-to-point interconnects between the modules using a standardized connector that is the same for each module. This, thereby, eliminates the need for a backplane. The modules may be configured in any order within a microelectronic assembly. No prior knowledge regarding the functions of an individual microelectronic module is required if the microelectronic modules conform to the standardized I/O of the standardized connector.

11 Claims, 2 Drawing Sheets

MICROELECTRONIC ASSEMBLIES

FIELD OF THE INVENTION

The currently described invention relates to microelectronic assemblies and methods for interconnecting microelectronic modules.

BACKGROUND

Standard interconnects are a critical component of developing a standard product line and off-the shelf hardware. The development of standard interconnects enables shorter electronics development cycles and lower electronics costs by enabling higher reuse. The challenge in the development of a standard physical implementation of inter-module/slice interfaces is the wiring of point-to-point inputs and outputs (I/O). Historical implementations of point-to-point connections are generally either a unique backplane interconnect with a standard connector I/O configuration for each microelectronic module (e.g., card or circuit board) in a microelectronic assembly or unique connector I/O configuration for each microelectronic module in a microelectronic assembly with a standard backplane interconnect. Development of the unique hardware increases cost and the development schedule.

Signals within a microelectronic assembly are traditionally routed from one printed wiring board to another through the use of a backplane. The backplane approach requires the design of an additional circuit board. This additional circuit board, or backplane, is a disadvantage to the unit for several reasons. The backplane must be redesigned when signals between printed wiring boards change or when new printed wiring boards are added to the microelectronic assembly. This can be costly and time consuming, especially if the change is made late in development.

In addition, the backplane limits the mechanical construction of the microelectronic assembly as the backplane needs to be placed perpendicular to the other printed wiring boards. Printed wiring boards must be put into a solid housing instead of being connected as slices, where each board has its own metal housing on the edge and the individual slice housings bolted together form the unit housing. Using a backplane means that the mechanical construction of the assembly must be redesigned when boards are added to the assembly because the housing is one solid metal structure. The requirement of a backplane also results in a larger size and weight for the assembly than would be necessary if the assembly housing was limited to the length and width of the printed wiring boards instead of having to be long enough to account for an additional perpendicular board. In addition, connecting to the backplane from a circuit card requires an additional connector within the signal path, which often causes signal degradation due to poor impedance control. Backplane connectors which guard against signal degradation can be expensive. The added connector, connections, and signal path length are a reliability liability. In addition, testing of individual boards within an assembly without the backplane can present challenges.

A need therefore exists for improved microelectronic assemblies and methods for interconnecting microelectronic modules.

SUMMARY

Embodiments described herein relate generally to microelectronic assemblies and methods for interconnecting microelectronic modules. Embodiments enable the creation of microelectronic modules that may be configured in any order within a microelectronic assembly. The microelectronic modules allow for point-to-point interconnects between the modules using a standardized connector that is the same for each module. This, thereby, eliminates the need for a backplane. In addition, because the modules may be configured in any order within a microelectronic assembly, no prior knowledge regarding the functions of an individual microelectronic module is required if the microelectronic modules conform to the standardized I/O of the standardized connector.

One embodiment is a microelectronic assembly that includes a first microelectronic module having a first group of N electrical interconnects ($L_1$ through $L_N$) and second group of N electrical interconnects ($M_1$ through $M_N$). A quantity J of the first group of N electrical interconnects ($L_1$ through $L_J$) of the first microelectronic module are consumed within the first microelectronic module and the remaining N−J electrical interconnects of the first group of electrical interconnects ($L_{J+1}$ to $L_N$) of the first microelectronic module are electrically coupled to the 1 through N−J ($M_1$ to $M_{N-J}$) electrical interconnects of the second group of N electrical interconnects on the first microelectronic module. The assembly also includes a second microelectronic module having a first group of N electrical interconnects ($L_1$ through $L_N$) and second group of N electrical interconnects ($M_1$ through $M_N$). The assembly also includes a first coupling medium that couples the second group of N electrical interconnects ($M_1$ through $M_N$) of the first microelectronic module to a first group of N electrical interconnects ($L_1$ through $L_N$) of the second microelectronic module. No backplane electrical interconnect extends between each of the microelectronic modules.

In some embodiments, the first coupling medium is a first connector plug/receptacle pair. The first connector plug/receptacle pair includes N electrical interconnects ($S_1$ through $S_N$) electrically coupled to the second group of N electrical interconnects ($M_1$ through $M_N$) of the first microelectronic module. The first connector plug/receptacle pair also includes N electrical interconnects ($T_1$ through $T_N$) electrically coupled to the first group of N electrical interconnects ($L_1$ through $L_N$) of the second microelectronic module. Each of the N electrical interconnects ($S_1$ through $S_N$) of the first connector are electrically coupled to the N electrical interconnects ($T_1$ through $T_N$) of the first connector plug/receptacle pair.

In some embodiments, the first coupling medium is a first connector that includes N electrical interconnects ($S_1$ through $S_N$) electrically coupled to the second group of N electrical interconnects ($M_1$ through $M_N$) of the first microelectronic module. The first connector also includes N electrical interconnects ($T_1$ through $T_N$) electrically coupled to the first group of N electrical interconnects ($L_1$ through $L_N$) of the second microelectronic module. Each of the N electrical interconnects ($S_1$ through $S_N$) of the first connector are electrically coupled to the N electrical interconnects ($T_1$ through $T_N$) of the first connector.

In some embodiments, the first microelectronic module includes a quantity J of electrical interconnects that are created on the first microelectronic module and that are electrically coupled to the N−J+1 through N electrical interconnects of the second group of N electrical interconnects ($M_1$ through $M_N$) of the first microelectronic module.

In some embodiments, each of the N electrical interconnects ($L_1$ through $L_N$) of the second microelectronic module are electrically connected to the corresponding N electrical interconnects ($M_1$ through $M_N$) of the first microelectronic module via the first coupling medium. The assembly includes a third microelectronic module having a first group of N electrical interconnects ($L_1$ through $L_N$) and a second group of N electrical interconnects ($M_1$ through $M_N$). The assembly also includes a second coupling medium that couples the second group of N electrical interconnects ($M_1$ through $M_N$) of the second microelectronic module to a first group of N electrical interconnects ($L_1$ through $L_N$) of the third microelectronic module.

In some embodiments, each of the N electrical interconnects ($L_1$ through $L_N$) of the second microelectronic module are electrically coupled to the N electrical interconnects ($M_1$ through $M_N$) on the second microelectronic module. In some embodiments, a quantity H of the second group of N electrical interconnects ($M_1$ through $M_N$) of the third microelectronic module are created on the third microelectronic module and a remaining quantity of N−H of the first group of electrical interconnects ($L_1$ through $L_{N-H}$) of the third microelectronic module are electrically coupled to the H+1 through N ($M_{H+1}$ through $M_N$) electrical interconnects on the third microelectronic module.

Another embodiment is a method for interconnecting microelectronic modules. The method includes consuming a quantity J ($L_1$ through $L_J$) of a first group of N total electrical interconnects ($L_1$ through $L_N$) of a first microelectronic module and electrically coupling the remaining N−J electrical interconnects ($L_{J+1}$ through $L_N$) of the first microelectronic module to 1 through N−J electrical interconnects on the first microelectronic module from a total of N electrical interconnects ($M_1$ through $M_N$). The method also includes electrically coupling, with a first coupling medium, the second group of N electrical interconnects ($M_1$ through $M_N$) of the first microelectronic module to a first group of N electrical interconnects ($L_1$ through $L_N$) of the second microelectronic module. No backplane electrical interconnect extends between each of the microelectronic modules.

In some embodiments, the method includes creating a quantity J of electrical interconnects on the first microelectronic module that are electrically coupled to the N−J+1 through N electrical interconnects of the second group of N electrical interconnects ($M_1$ through $M_N$) of the first microelectronic module.

In some embodiments, the method includes electrically coupling each of the N electrical interconnects ($L_1$ through $L_N$) of the second microelectronic module to the corresponding N electrical interconnects ($M_1$ through $M_N$) of the first microelectronic module via the first coupling medium, and electrically coupling, with a second coupling medium, the second group of N electrical interconnects ($M_1$ through $M_N$) of the second microelectronic module to a first group of N electrical interconnects ($L_1$ through $L_N$) of a third microelectronic module.

In some embodiments, the method includes coupling each of the N input electrical interconnects ($L_1$ through $L_N$) of the second microelectronic module to the N output electrical interconnects ($M_1$ through $M_N$) on the second microelectronic module. In some embodiments, the method includes creating a quantity H of the second group of N electrical interconnects ($M_1$ through $M_N$) on the third microelectronic module, and electrically coupling a remaining quantity of N−H of the first group of electrical interconnects ($L_1$ through $L_{N-H}$) of the third microelectronic module to the H+1 through N ($M_{H+1}$ through $M_N$) output electrical interconnects on the third microelectronic module.

Another embodiment is a microelectronic assembly that includes a first microelectronic module having a first group of N electrical interconnects ($L_1$ through $L_N$) and second group of N electrical interconnects ($M_1$ through $M_N$). A quantity H of the first group of N electrical interconnects ($L_{N-H+1}$ through $L_N$) of the first microelectronic module are consumed on the first microelectronic module and a remaining N−H of the first group of electrical interconnects ($L_1$ through $L_{N-H}$) of the first microelectronic module are electrically coupled to the H+1 through N ($M_{H+1}$ through $M_N$) electrical interconnects on the first microelectronic module. The assembly also includes a second microelectronic module having a first group of N electrical interconnects ($L_1$ through $L_N$) and second group of N electrical interconnects ($M_1$ through $M_N$). The assembly also includes a first coupling medium that couples the second group of N electrical interconnects ($M_1$ through $M_N$) of the first microelectronic module to a first group of N electrical interconnects ($L_1$ through $L_N$) of the second microelectronic module. No backplane electrical interconnect extends between each of the microelectronic modules.

In some embodiments, each of the first group of N electrical interconnects ($L_1$ through $L_N$) of the second microelectronic module are electrically connected to the corresponding N electrical interconnects ($M_1$ through $M_N$) of the first microelectronic module via the first coupling medium. The assembly also includes a third microelectronic module having a first group of N electrical interconnects ($L_1$ through $L_N$) and second group of N electrical interconnects ($M_1$ through $M_N$), and a second coupling medium that couples the second group of N electrical interconnects ($M_1$ through $M_N$) of the second microelectronic module to a first group of N electrical interconnects ($L_1$ through $L_N$) of the third microelectronic module.

In some embodiments, each of the N electrical interconnects ($L_1$ through $L_N$) of the second microelectronic module are electrically coupled to the N electrical interconnects ($M_1$ through $M_N$) on the second microelectronic module. In some embodiments, a quantity J ($M_{N-J+1}$ through $M_N$) of the second group of N electrical interconnects ($M_1$ through $M_N$) of the third microelectronic module are consumed on the third microelectronic module and a remaining quantity of N−J of the first group of electrical interconnects ($L_{J+1}$ through $L_N$) of the third microelectronic module are electrically coupled to the 1 through N−J electrical interconnects ($M_1$ through $M_{N-J}$) on the third microelectronic module.

Another embodiment is a method for interconnecting microelectronic modules. The method includes consuming a quantity H ($L_{N-H+1}$ through $L_N$) of a first group of N total electrical interconnects ($L_1$ through $L_N$) of a first microelectronic module and electrically coupling the remaining N−H electrical interconnects ($L_1$ through $L_{N-H}$) of the first microelectronic module to the H+1 through N electrical interconnects ($M_{H+1}$ through $M_N$) on the first microelectronic module. The method also includes electrically coupling, with a first coupling medium, the second group of N electrical interconnects ($M_1$ through $M_N$) of the first microelectronic module to a first group of N electrical interconnects ($L_1$ through $L_N$) of the second microelectronic module. No backplane electrical interconnect extends between each of the microelectronic modules.

In some embodiments, the method includes electrically coupling each of the N electrical interconnects ($L_1$ through $L_N$) of the second microelectronic module to the corresponding N electrical interconnects ($M_1$ through $M_N$) of the first microelectronic module via the first coupling medium. The method also includes electrically coupling, with a second coupling medium, the second group of N electrical interconnects ($M_1$ through $M_N$) of the second microelectronic module to a first group of N electrical interconnects ($L_1$ through $L_N$) of a third microelectronic module.

In some embodiments, the method includes coupling each of the N electrical interconnects ($L_1$ through $L_N$) of the second microelectronic module to the N electrical interconnects ($M_1$ through $M_N$) on the second microelectronic module.

In some embodiments, the method includes consuming a quantity J ($M_1$ through $M_N$) of the N electrical interconnects ($M_1$ through $M_N$) of the third microelectronic module on the third microelectronic module, and electrically coupling a remaining quantity of N−J of the first group of electrical interconnects ($L_{J+1}$ through $L_N$) of the third microelectronic module to the 1 through N−J electrical interconnects ($M_1$ through $M_{N−J}$) on the third microelectronic module.

Other aspects and advantages of the current invention will become apparent from the following detailed description, taken in conjunction with the accompanying drawings, illustrating the principles of the invention by way of example only.

BRIEF DESCRIPTION OF THE DRAWINGS

The foregoing features of various embodiments of the invention will be more readily understood by reference to the following detailed descriptions in the accompanying drawings, in which.

DETAILED DESCRIPTION OF ILLUSTRATIVE EMBODIMENTS

Figure 1:
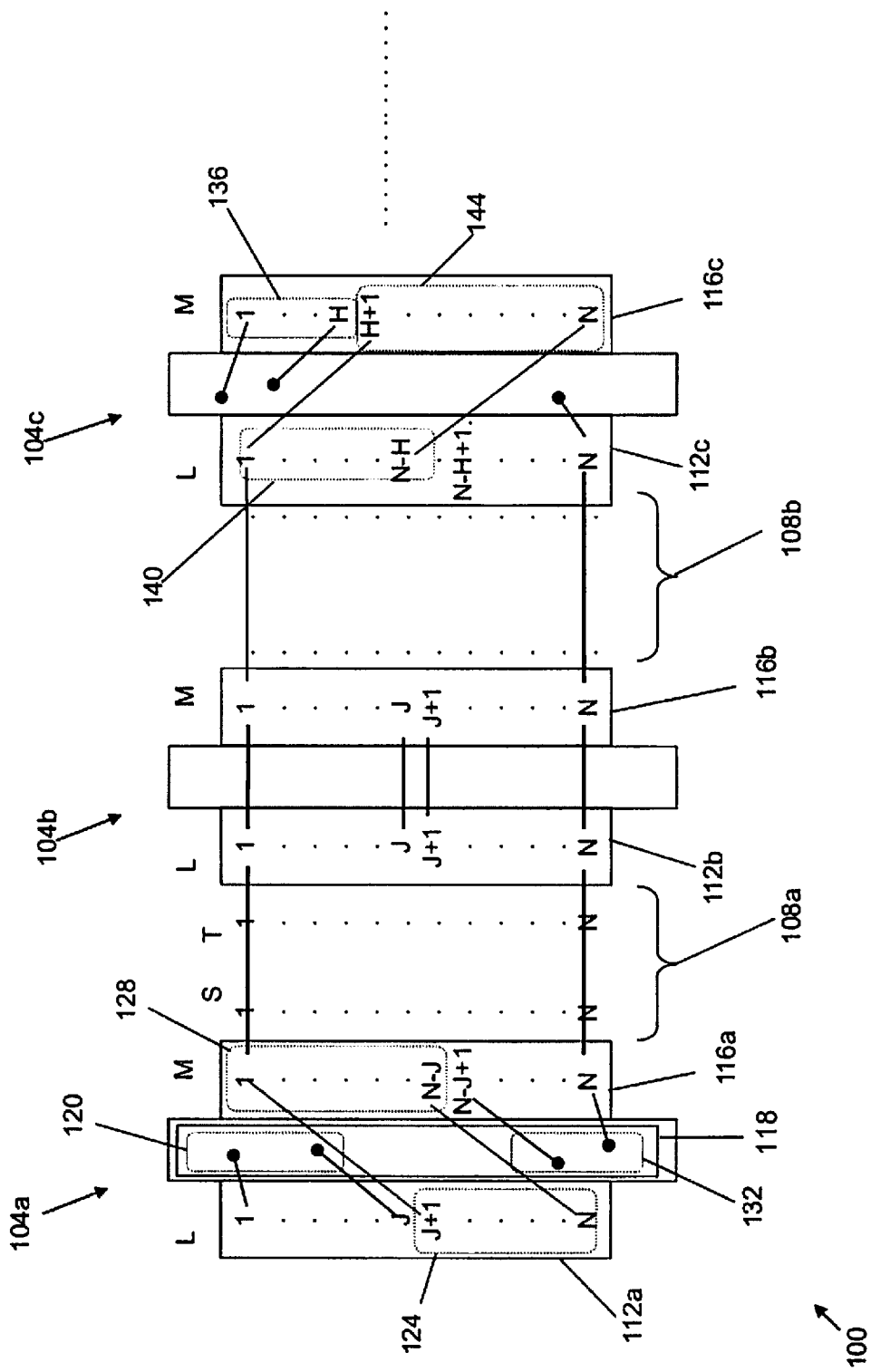
FIG. 1 is a schematic illustration of a microelectronic assembly, according to an illustrative embodiment.

FIG. 1 is a schematic illustration of a microelectronic assembly 100, according to an illustrative embodiment. The microelectronic assembly 100 includes a plurality of microelectronic modules (generally 104, for example, circuit boards). In this embodiment, the microelectronic assembly 100 includes a first microelectronic module 104a, a second microelectronic module 104b and a third microelectronic module 104c. Alternative embodiments can include additional microelectronic modules 104.

The first microelectronic module 104a is coupled to the second microelectronic module 104b via coupling medium 108a (generally 108) (e.g., a connector plug/receptacle pair, connector, spring contact probe, flat cable clamped to both microelectronic modules, or wire harness soldered to each microelectronic module). The second microelectronic module 104b is coupled to the third microelectronic module 104c via coupling medium 108b. Because the microelectronic modules 104 are coupled together by a standardized I/O coupling medium 108, no backplane is required for signals to be passed between the modules 104.

Embodiments described herein enable the creation of microelectronic modules that may be configured in any order within a microelectronic assembly. The microelectronic modules allow for point-to-point interconnects between the modules using a standardized connector that is the same for each module. This, thereby, eliminates the need for a backplane. In addition, because the modules may be configured in any order within a microelectronic assembly, no prior knowledge regarding the functions of an individual microelectronic module is required if the microelectronic modules conform to the standardized I/O of the standardized connector.

The first microelectronic module 104a includes a first group 112a of N electrical interconnects ($L_1$ through $L_N$) and a second group 116a of N electrical interconnects ($M_1$ through $M_N$). A quantity J 120 of the first group 112a of N electrical interconnects ($L_1$ through $L_N$) are consumed within the first microelectronic module 104a (by, for example, a circuit component 118 mounted on the module 104a). The remaining N−J electrical interconnects 124 of N electrical interconnects ($L_{J+1}$ through $L_N$) of the first group 112a are electrically coupled to the 1 through N−J ($M_1$ through $M_{N−J}$) electrical interconnects 128 of the second group of N electrical interconnects 116a on the first microelectronic module 104a.

In this embodiment, a quantity J of electrical interconnects 132 are created on the first microelectronic module 104a to replace the consumed interconnects (quantity J 120). The electrical interconnects 132 are electrically coupled to the N−J+1 through N electrical interconnects of the second group 116a of N electrical interconnects ($M_1$ through $M_N$) of the first microelectronic module 104a. In some embodiments, however, less interconnects (e.g., less than the quantity J) are created on the first microelectronic module 104a.

The second microelectronic module 104b includes a first group 112b of N electrical interconnects ($L_1$ through $L_N$) and second group 116b of N electrical interconnects ($M_1$ through $M_N$). The coupling medium 108a couples the second group 116a of electrical interconnects ($M_1$ through $M_N$) of the first microelectronic module 104a to the first group 112b of N electrical interconnects ($L_1$ through $L_N$) of the second microelectronic module 104b. Each of the N electrical interconnects ($S_1$ through $S_N$) of the first coupling medium 108a are electrically coupled to the N electrical interconnects ($T_1$ through $T_N$) of the first coupling medium 108a.

The N electrical interconnects ($S_1$ through $S_N$) of the coupling medium 108a are coupled to the second group 116a of N electrical interconnects ($M_1$ through $M_N$) of the first microelectronic module 104a. The N electrical interconnects ($T_1$ through $T_N$) of the coupling medium 108a are coupled to the first group 112b of N electrical interconnects ($L_1$ through $L_N$) of the second microelectronic module 104b. Each of the N electrical interconnects ($L_1$ through $L_N$) of the second microelectronic module 104b are electrically coupled to the N electrical interconnects ($M_1$ through $M_N$) on the second microelectronic module.

The third microelectronic module 104c includes a first group 112c of N electrical interconnects ($L_1$ through $L_N$) and a second group 116c of N electrical interconnects ($M_1$ through $M_N$). The assembly 100 also includes a second coupling medium 108b that couples the second group 116b of N electrical interconnects ($M_1$ through $M_N$) of the second microelectronic module 104B to the first group 112c of N electrical interconnects ($L_1$ through $L_N$) of the third microelectronic module 104c.

A quantity H ($L_{N−H+1}$ through $L_N$) of the first group 112c of the N electrical interconnects ($L_1$ through $L_N$) are consumed on the third microelectronic module 104c. A quantity H ($M_1$ through $M_H$) 136 of the second group 116c of the N electrical interconnects ($M_1$ through $M_N$) of the third microelectronic module 104c are created on the third microelectronic module 104c. A remaining quantity of N−H 140 of the first group of electrical interconnects ($L_1$ through $L_{N−H}$) of the third microelectronic module 104c are electrically coupled to the H+1 through N electrical interconnects ($M_{H+1}$ through $M_N$) 144 on the third microelectronic module 104c.

Figure 2:
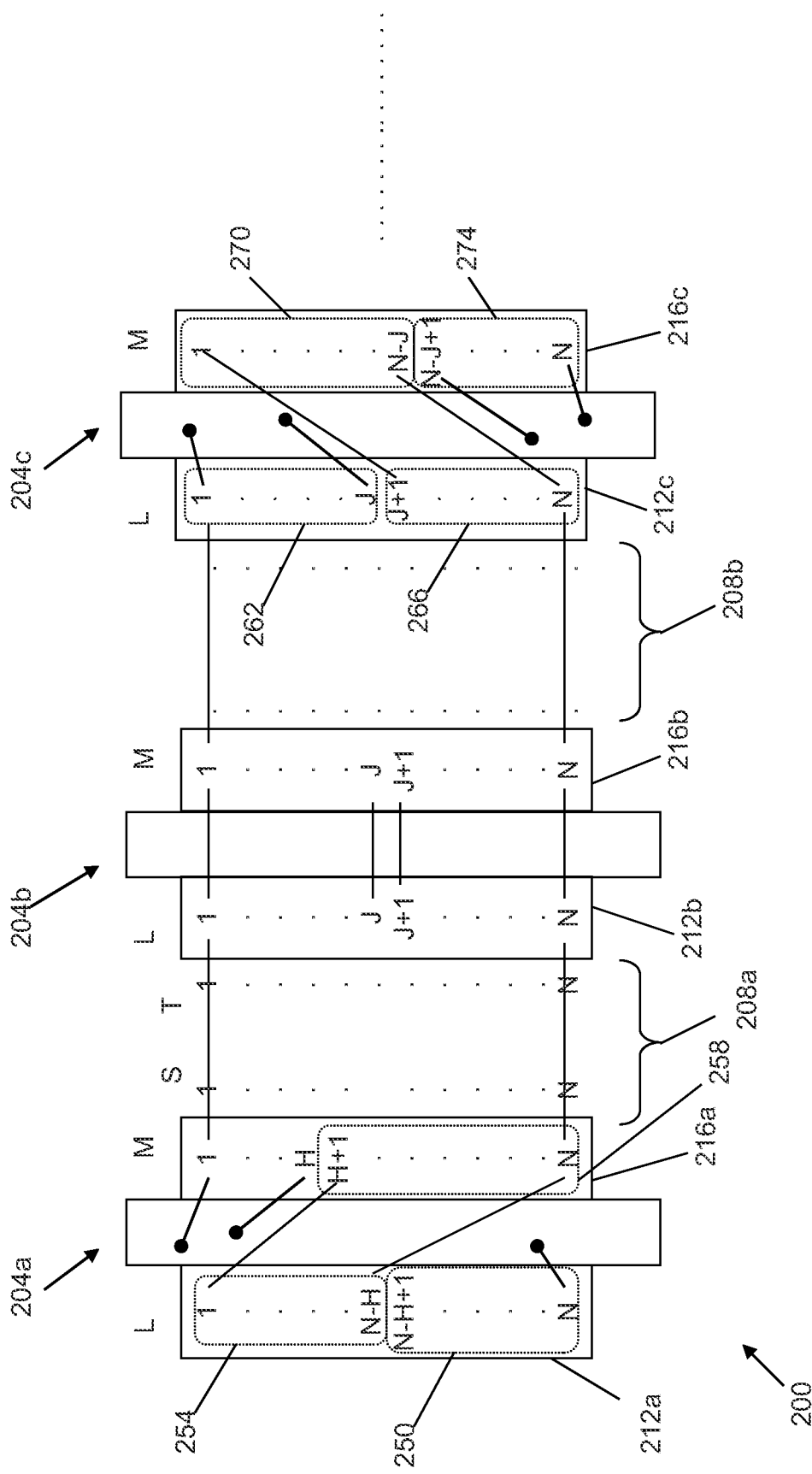
FIG. 2 is a schematic illustration of a microelectronic assembly, according to another illustrative embodiment.

FIG. 2 is a schematic illustration of a microelectronic assembly 200, according to an illustrative embodiment. The microelectronic assembly 200 includes a plurality of microelectronic modules (generally 204, for example, circuit boards). In this embodiment, the microelectronic assembly 200 includes a first microelectronic module 204a, a second microelectronic module 204b and a third microelectronic module 204c. Alternative embodiments can include additional microelectronic modules 204. The first microelectronic module 204a is coupled to the second microelectronic module 204b via coupling medium 208a (generally 208) (e.g., a connector plug/receptacle pair, connector, spring contact probe, flat cable clamped to both microelectronic modules, or wire harness soldered to each microelectronic module). The second microelectronic module 204b is coupled to the third microelectronic module 204c via coupling medium 208b.

The first microelectronic module 204a includes a first group 212a of N electrical interconnects ($L_1$ through $L_N$) and second group 216a of N electrical interconnects ($M_1$ through $M_N$). A quantity H 250 of the first group 212a of N electrical interconnects ($L_{N-H+1}$ through $L_N$) of the first microelectronic module 204a are consumed on the first microelectronic module 204a and a remaining quantity N–H 254 of the first group 212a of electrical interconnects ($L_1$ through $L_{N-H}$) of the first microelectronic module 204a are electrically coupled to the H+1 through N ($M_{H+1}$ through $M_N$) 258 electrical interconnects on the first microelectronic module 204a. The second microelectronic module 204b includes a first group of N electrical interconnects ($L_1$ through $L_N$) and second group of N electrical interconnects ($M_1$ through $M_N$). The first coupling medium 208a couples the second group of N electrical interconnects ($M_1$ through $M_N$) of the first microelectronic module 204a to a first group of N electrical interconnects ($L_1$ through $L_N$) of the second microelectronic module 212b.

Each of the first group of N electrical interconnects ($L_1$ through $L_N$) of the second microelectronic module 204b are electrically connected to the corresponding N electrical interconnects ($M_1$ through $M_N$) of the first microelectronic module 204a via the first coupling medium 208a. The third microelectronic module 204c includes a first group of N electrical interconnects ($L_1$ through $L_N$) and second group of N electrical interconnects ($M_1$ through $M_N$). The second coupling medium 208b couples the second group of N electrical interconnects ($M_1$ through $M_N$) of the second microelectronic module to a first group of N electrical interconnects ($L_1$ through $L_N$) of the third microelectronic module.

Each of the N electrical interconnects ($L_1$ through $L_N$) of the second microelectronic module are electrically coupled to the N electrical interconnects ($M_1$ through $M_N$) on the second microelectronic module. A quantity J ($L_1$ through $L_J$) 262 of the first group of N electrical interconnects ($L_1$ through $L_N$) of the third microelectronic module 204c are consumed on the third microelectronic module 204c and a remaining quantity of N–J 266 of the first group of electrical interconnects ($L_{J+1}$ through $L_N$) of the third microelectronic module 204c are electrically coupled to the 1 through N–J 270 electrical interconnects ($M_1$ through $M_{N-J}$) on the third microelectronic module 204c. A quantity J (N–J+1 through N) 274 of the third microelectronic module 104c are created on the third microelectronic module 104c to replace the quantity J ($L_1$ through $L_J$) 262 of the first group of N electrical interconnects ($L_1$ through $L_N$) of the third microelectronic module 204c that were consumed on the third microelectronic module 204c.

"Comprise", "include", and/or plural forms of each are open ended and include the listed parts and can include additional parts that are not listed. "And/or" is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The invention claimed is:

1. A microelectronic assembly, comprising:
   a first circuit board having a first group of N electrical interconnects ($L_1$ through $L_N$) and second group of N electrical interconnects ($M_1$ through $M_N$),
   wherein a quantity J of the first group of N electrical interconnects ($L_1$ through $L_J$) of the first circuit board are consumed by a circuit component mounted on the first circuit board and the remaining N–J electrical interconnects of the first group of electrical interconnects ($L_{J+1}$ to $L_N$) of the first circuit board are electrically coupled to the 1 through N–J ($M_1$ to $M_{N-J}$) electrical interconnects of the second group of N electrical interconnects on the first circuit board;
   a second circuit board having a first group of N electrical interconnects ($L_1$ through $L_N$) and second group of N electrical interconnects ($M_1$ through $M_N$); and
   a first coupling medium that couples the second group of N electrical interconnects ($M_1$ through $M_N$) of the first circuit board to the first group of N electrical interconnects ($L_1$ through $L_N$) of the second circuit board;
   wherein there is no backplane electrical interconnect extending between each of the circuit boards.

2. The microelectronic assembly of claim 1, wherein the first coupling medium is a first connector plug/receptacle pair, comprising:
   N electrical interconnects ($S_1$ through $S_N$) electrically coupled to the second group of N electrical interconnects ($M_1$ through $M_N$) of the first circuit board;
   N electrical interconnects ($T_1$ through $T_N$) electrically coupled to the first group of N electrical interconnects ($L_1$ through $L_N$) of the second circuit board;
   wherein each of the N electrical interconnects ($S_1$ through $S_N$) of the first connector are electrically coupled to the N electrical interconnects ($T_1$ through $T_N$) of the first connector plug/receptacle pair.

3. The microelectronic assembly of claim 1, wherein the first coupling medium is a first connector comprising:
   N electrical interconnects ($S_1$ through $S_N$) electrically coupled to the second group of N electrical interconnects ($M_1$ through $M_N$) of the first circuit board;
   N electrical interconnects ($T_1$ through $T_N$) electrically coupled to the first group of N electrical interconnects ($L_1$ through $L_N$) of the second circuit board;
   wherein each of the N electrical interconnects ($S_1$ through $S_N$) of the first connector are electrically coupled to the N electrical interconnects ($T_1$ through $T_N$) of the first connector.

4. The microelectronic assembly of claim 1, the first circuit board comprising a quantity J of electrical interconnects that are created on the first circuit board and that are electrically coupled to the N–J+1 through N electrical interconnects of the second group of N electrical interconnects ($M_1$ through $M_N$) of the first circuit board.

5. The microelectronic assembly of claim 1, wherein each of the N electrical interconnects ($L_1$ through $L_N$) of the second circuit board are electrically connected to the corresponding N electrical interconnects ($M_1$ through $M_N$) of the first circuit board via the first coupling medium and the assembly further comprising:
   a third circuit board having a first group of N electrical interconnects ($L_1$ through $L_N$) and a second group of N electrical interconnects ($M_1$ through $M_N$); and a second coupling medium that couples the second group of N electrical interconnects ($M_1$ through $M_N$) of the second circuit board to a first group of N electrical interconnects ($L_1$ through $L_N$) of the third circuit board.

6. The microelectronic assembly of claim 5, wherein each of the N electrical interconnects ($L_1$ through $L_N$) of the second circuit board are electrically coupled to the N electrical interconnects ($M_1$ through $M_N$) on the second circuit board.

7. The microelectronic assembly of claim 6, wherein a quantity H of the second group of N electrical interconnects ($M_1$ through $M_N$) of the third circuit board are created on the third circuit board and a remaining quantity of N−H of the first group of electrical interconnects ($L_1$ through $L_{N-H}$) of the third circuit board are electrically coupled to the H+1 through N ($M_{H+1}$ through $M_N$) electrical interconnects on the third circuit board.

8. A microelectronic assembly, comprising:
a first circuit board having a first group of N electrical interconnects ($L_1$ through $L_N$) and second group of N electrical interconnects ($M_1$ through $M_N$),
wherein a quantity H of the first group of N electrical interconnects ($L_{N-H+1}$ through $L_N$) of the first circuit board are consumed by a circuit component mounted on the first circuit board and a remaining N−H of the first group of electrical interconnects ($L_1$ through $L_{N-H}$) of the first circuit board are electrically coupled to the H+1 through N ($M_{H+1}$ through $M_N$) electrical interconnects on the first circuit board;
a second circuit board having a first group of N electrical interconnects ($L_1$ through $L_N$) and second group of N electrical interconnects ($M_1$ through $M_N$); and a first coupling medium that couples the second group of N electrical interconnects ($M_1$ through $M_N$) of the first circuit board to a first group of N electrical interconnects ($L_1$ through $L_N$) of the second circuit board,
wherein there is no backplane electrical interconnect extending between each of the circuit boards.

9. The microelectronic assembly of claim 8, wherein each of the first group of N electrical interconnects ($L_1$ through $L_N$) of the second circuit board are electrically connected to the corresponding N electrical interconnects ($M_1$ through $M_N$) of the first circuit board via the first coupling medium and the assembly further comprising:
a third circuit board having a first group of N electrical interconnects ($L_1$ through $L_N$) and second group of N electrical interconnects ($M_1$ through $M_N$); and
a second coupling medium that couples the second group of N electrical interconnects ($M_1$ through $M_N$) of the second circuit board to a first group of N electrical interconnects ($L_1$ through $L_N$) of the third circuit board.

10. The microelectronic assembly of claim 9, wherein each of the N electrical interconnects ($L_1$ through $L_N$) of the second circuit board are electrically coupled to the N electrical interconnects ($M_1$ through $M_N$) on the second circuit board.

11. The microelectronic assembly of claim 10, wherein a quantity J ($L_1$ through $L_J$) of the first group of N electrical interconnects ($L_1$ through $L_N$) of the third circuit board are consumed by a circuit component mounted on the third circuit board and a remaining quantity of N−J of the first group of electrical interconnects ($L_{J+1}$ through $L_N$) of the third circuit board are electrically coupled to the 1 through N−J electrical interconnects ($M_1$ through $M_{N-J}$) on the third circuit board.

* * * * *